(12) United States Patent
Himmer

(10) Patent No.: US 9,735,333 B2
(45) Date of Patent: Aug. 15, 2017

(54) THERMOELECTRIC MODULE

(71) Applicant: MAHLE International GmbH, Stuttgart (DE)

(72) Inventor: Thomas Himmer, Reichenbach (DE)

(73) Assignee: MAHLE International GmbH, Stuttgart (DE)

( * ) Notice: Subject to any disclaimer, the term of this patent is extended or adjusted under 35 U.S.C. 154(b) by 0 days.

(21) Appl. No.: 14/619,684

(22) Filed: Feb. 11, 2015

(65) Prior Publication Data

US 2015/0155466 A1   Jun. 4, 2015

Related U.S. Application Data

(63) Continuation of application No. PCT/EP2013/066958, filed on Aug. 14, 2013.

(30) Foreign Application Priority Data

Aug. 17, 2012  (DE) .................. 10 2012 214 704

(51) Int. Cl.
    *H01L 35/32*    (2006.01)
    *H01L 35/10*    (2006.01)
(52) U.S. Cl.
    CPC .............. *H01L 35/32* (2013.01); *H01L 35/10* (2013.01)
(58) Field of Classification Search
    CPC ...................... H01L 35/32; H01L 35/10
    See application file for complete search history.

(56) References Cited

U.S. PATENT DOCUMENTS

| | | | |
|---|---|---|---|
| 3,539,399 | A | 11/1970 | Harvey |
| 6,474,060 | B2 | 11/2002 | Khair |
| 7,100,369 | B2 | 9/2006 | Yamaguchi et al. |
| 7,612,446 | B2 | 11/2009 | Dang et al. |
| 8,110,736 | B2 | 2/2012 | Iwanade et al. |
| 9,291,375 | B2 | 3/2016 | Brehm et al. |
| 2004/0076214 | A1 | 4/2004 | Bell |
| 2009/0236087 | A1 | 9/2009 | Horio |
| 2010/0031987 | A1 | 2/2010 | Bell et al. |

FOREIGN PATENT DOCUMENTS

| | | |
|---|---|---|
| CN | 101188217 A | 5/2008 |
| CN | 101515628 A | 8/2009 |
| CN | 1015333704 A | 10/2009 |

(Continued)

OTHER PUBLICATIONS

Machine English Translation WO 1998/056047.*

(Continued)

*Primary Examiner* — Shannon Gardner
(74) *Attorney, Agent, or Firm* — Muncy, Geissler, Olds & Lowe, P.C.

(57) ABSTRACT

A thermoelectric module is provided that includes a housing that has at least two opposite walls, and a plurality of thermoelectric elements that have at least two opposite surfaces, and a plurality of conductor bridges. At least two thermoelectric elements are connected to a conductor bridge, and the thermoelectric elements, via one of the surfaces thereof, are in thermal contact with a support element, a combination of at least two thermoelectric elements and a conductor bridge being in thermal contact with a support element.

19 Claims, 9 Drawing Sheets

(56) References Cited

FOREIGN PATENT DOCUMENTS

| | | |
|---|---|---|
| CN | 102239579 A | 11/2011 |
| DE | 40 06 861 A1 | 9/1991 |
| DE | 10 2006 037 540 A1 | 2/2007 |
| DE | 10 2006 040 283 A1 | 3/2007 |
| DE | 10 2009 013 535 A1 | 9/2010 |
| DE | 10 2009 025 033 | 12/2010 |
| DE | 10 2009 046 318 A1 | 5/2011 |
| EP | 1 475 532 A2 | 11/2004 |
| EP | 1 522 685 A1 | 4/2005 |
| EP | 1 230 475 B1 | 3/2006 |
| EP | 2 230 701 A2 | 9/2010 |
| EP | 2 262 018 A2 | 12/2010 |
| JP | 10-281015 A | 10/1998 |
| JP | 2000-282960 A | 10/2000 |
| JP | 2003-204087 A | 7/2003 |
| JP | 2004-068608 A | 3/2004 |
| JP | 2005-083251 A | 3/2005 |
| JP | 2005-117836 A | 4/2005 |
| JP | 2008-277584 A | 11/2008 |
| JP | 2009-260173 A | 11/2009 |
| RU | 2 142 177 C1 | 11/1999 |
| WO | WO 98/56047 A1 | 12/1998 |
| WO | WO 2007/026432 A1 | 3/2007 |
| WO | 2011/082912 A | 7/2011 |

OTHER PUBLICATIONS

Chinese Office Action for Chinese Application No. 201380043859.4 dated Aug. 1, 2016 with English translation.
Chinese Office Action for Chinese Application No. 201380043912.0 dated Aug. 25, 2016 with English translation.
Chinese Office Action for Chinese Application No. 201380043859.4 dated Feb. 27, 2017 with English translation.

\* cited by examiner

THERMOELECTRIC MODULE

This nonprovisional application is a continuation of International Application No. PCT/EP2013/066958, which was filed on Aug. 14, 2013, and which claims priority to German Patent Application No. DE 10 2012 214 704.7, which was filed in Germany on Aug. 17, 2012, and which are both herein incorporated by reference.

BACKGROUND OF THE INVENTION

Field of the Invention

The present invention relates to a thermoelectric module comprising a housing, which has at least two opposite walls, a plurality of thermoelectric elements, which have at least two opposite surfaces, and a plurality of conductive bridges, whereby at least two thermoelectric elements are connected to a conductive bridge, and the thermoelectric elements, with one of the surfaces thereof, are in thermal contact with a support element, whereby a combination of at least two thermoelectric elements and a conductive bridge is in thermal contact with a support element.

Description of the Background Art

In order to utilize energy that is contained in the exhaust gas of a motor vehicle, for example, thermoelectric elements may be employed that produce electrical energy by using the Seebeck effect.

The thermoelectric elements includes thermoelectrically active materials, which allow electrical energy to be produced from a temperature difference at the interfaces of the thermoelectric elements. To this end, the thermoelectric materials should be exposed to a temperature difference, so that one of their interfaces is subjected to a fluid with a high temperature and one of their interfaces, in the ideal case the surface opposite the first interface, to a fluid with a lower temperature.

The exhaust gas line lends itself as a source for a fluid with a high temperature, particularly in the motor vehicle. The exhaust gas temperatures are very high over the entire exhaust gas line, so that a thermoelectric device that contains thermoelectric materials can be integrated at many places in the exhaust gas line.

A coolant stream of the vehicle, for example, lends itself as a source for a fluid with a lower temperature. For this purpose, either an already present coolant circuit can be expanded, or if necessary an additional coolant circuit can be integrated.

Among others, tellurides, skutterudites, silicides, or Half-Heusler materials can be used as the thermoelectric material.

These and other thermoelectric materials have in common that they are sensitive to mechanical effects such as, for instance, stresses and impacts. Thermally induced stresses occur at times in thermoelectric devices known today. These result in expansion and compression of the material, experienced by the material due to temperature effects.

In particular the non-optimal prevention of thermal stresses within thermoelectric devices and thereby the protection of thermoelectric elements from damage are disadvantageous in the prior art.

SUMMARY OF THE INVENTION

It is therefore an object of the present invention to provide a thermoelectric module, which reduces as greatly as possible the formation of thermal stresses and takes up arising thermal stresses especially advantageously, in order to thereby prevent a negative effect on the thermoelectric materials.

An exemplary embodiment of the invention relates to a thermoelectric module comprising a housing with at least two opposite walls, a plurality of thermoelectric elements with at least two opposite surfaces, and a plurality of conductive bridges, whereby at least two thermoelectric elements are connected to a conductive bridge, and the thermoelectric elements, with one of the surfaces thereof, are in thermal contact with a support element, whereby in each case a combination of at least two thermoelectric elements and a conductive bridge is in thermal contact with a support element.

A further exemplary embodiment has at least one thermal stress equalizing device arranged in the thermoelectric module, whereby the thermal stress equalizing device is formed by at least one first plate-shaped support element.

A device for reducing thermal stresses is used, for example, for relieving the thermoelectric elements and the conductive bridges connecting them. In particular, the thermoelectric elements are especially sensitive to mechanical loads. Because of the great temperature difference that results between the opposite walls of the thermoelectric module and the thermal load on the side of the hot fluid, expansions of the module occur in part and as a result of these a mechanical load on the thermoelectric modules.

This harmful effect for the thermoelectric elements can be reduced by the thermal stress equalizing device.

The use of plate-shaped support elements as a thermal stress equalizing device is especially advantageous, because they can accommodate the thermoelectric elements, can be made very flat because of their plate-shaped form, and are therefore easy to integrate into the wall of a housing.

In an embodiment of the invention, it can be provided that the thermal stress equalizing device is formed by a plurality of plate-shaped support elements, whereby individual support elements are elastically connected at their edge regions to other support elements.

It is possible to compensate greater changes in length by the plurality of the plate-shaped support elements. In contrast to a design with only one support element, which is movable only relative to the housing, the individual support elements can be moved relative to one another here as well.

The at least first support element, provided as the thermal stress equalizing device, can be connected elastically to a wall of the housing.

The elastic connection of the support element to the housing enables a relative movement of the support element to the housing, which serves to reduce the thermal stresses.

The thermal stress equalizing device in the thermoelectric module can be formed by a first plate-shaped support element, which is connected elastically to a wall of the housing and/or to a second plate-shaped support element.

It is also expedient if a wall of the housing has a cutout.

The plate-shaped support elements can be inserted in this cutout and from there provide for a compensation of the change in length. The cutout in this case is covered either by one plate-shaped support element alone or by a plurality of plate-shaped support elements.

It is advantageous, furthermore, if one or more plate-shaped support elements cover the cutout in the housing of the thermoelectric module and close it fluid-tight.

Cutouts of various sizes can be covered by the use of a plurality of plate-shaped support elements. Depending on the necessary length compensation and the provided number of thermoelectric elements, it can be advantageous to use a plurality of plate-shaped support elements. The number of thermoelectric elements on each plate-shaped support element should not be selected too large and is two in the ideal case. The more thermoelectric elements are arranged on each plate-shaped element, the greater the damaging effect on the thermoelectric elements due to thermal stresses.

Because only the plate-shaped support elements cover the cutout or cutouts in the housing, a fluid-tight connection of the plate-shaped support elements with the housing is advantageous. The penetration of the fluid flowing around the thermoelectric module into the interior of the module is prevented in this way.

Care must be taken in the case of the connector that it has both a sufficiently high ductility and a sufficiently high temperature resistance.

It is also expedient, if the thermoelectric elements, with one of the surfaces thereof, are in thermal contact with one of the walls of the housing and with the other surface are in thermal contact with a plate-shaped support element.

Because the plate-shaped support elements, on the one hand, and the wall opposite the plate-shaped support elements of the housing, on the other, represent elements that are subjected to the fluids flowing around the thermoelectric module, it is to be preferred if the thermoelectric elements are connected to them in a thermally conductive manner. As a result, the thermal resistance is kept as low as possible and the efficiency of the thermoelectric module is increased.

It is advantageous, moreover, if a plate-shaped support element overlaps the housing at a connection site between the support element and the housing and/or overlaps the support element at a connection site between the support element and another support element.

It can be realized especially advantageously by an overlapping to connect fluid-tight the support elements among one another and the support elements to the housing. Also, the region of the overlapping forms the connecting region into which the connector is introduced. A larger overlapping region enables in addition greater relative movements, on the one hand, of the plate-shaped support elements among one another and, on the other, of the plate-shaped support elements to the housing.

The plate-shaped support elements can be movable relative to one another and relative to the housing of the thermoelectric module.

A compensation of length can occur by the movability relative to one another, as a result of which the thermoelectric elements are relieved.

The plate-shaped support elements at their edge region can have an at least partially peripheral flange region.

The flange region makes it possible to be able to better orient the individual support elements to one another or also to the housing. In addition, the connection of the plate-shaped support elements among one another is easier to produce. Moreover, the flange additionally increases the stability of the thermoelectric module by the overlapping brought about by it.

Furthermore, the flange can serve as a receiving region for a connector, which simplifies the assembly process.

In an exemplary embodiment of the invention, it is advantageous, if in the case of a thermoelectric module, the thermal stress equalizing device in the thermoelectric module is formed by a plurality of tub-shaped support elements that have a bottom region and a peripheral edge protruding from the bottom region.

The tub-shaped support elements in this case serve to receive two or more thermoelectric elements. Similar to the case of the plate-shaped support elements, the number of thermoelectric element per tub-shaped support element should not be too large to keep the damaging effect of thermal stresses on the thermoelectric elements due to an expansion in length of one of the tub-shaped support elements as low as possible.

The tub-shaped support elements can be connected to one another in the area of their peripheral edge, whereby a gap is left between the bottom regions of the tub-shaped support elements.

A length compensation due to a thermally induced expansion is possible via the gap arising between the bottom regions of adjacent tub-shaped support elements. The gap is made smaller by the expansion of the individual tub-shaped support elements. The absolute external dimensions of the thermoelectric module are not influenced or influenced only insignificantly by a change in length of the tub-shaped support element.

It is advantageous, furthermore, for each of the tub-shaped support elements to have at least two thermoelectric elements that are connected to a conductive bridge.

An arrangement of at least two thermoelectric elements per tub-shaped support element is to be preferred, because the connection of the individual thermoelectric elements among one another is realized with conductive bridges, which are arranged alternating on two opposite surfaces of the thermoelectric elements. The connection of an individual thermoelectric element to an individual thermoelectric element in an adjacent tub-shaped support element would lead to a complex design for the conductive bridges, resulting in a disadvantage with respect to production and cost.

However, the number of thermoelectric elements per tub-shaped support element should also not be substantially greater than two, because otherwise the risk of stresses due to the expansion of the tub-shaped support element itself in the individual thermoelectric elements occurs, leading to damage to the thermoelectric elements.

In an embodiment, at least two thermoelectric elements of two adjacent tub-shaped support elements can be connected to one another via a conductive bridge.

A cross-linking of the thermoelectric elements to one another is achieved by the connection of the thermoelectric elements via the tub-shaped support elements. The thermoelectric elements are connected in series in this case. The two thermoelectric elements arranged in a tub-shaped support element are connected to a further conductive bridge. The conductive bridges here are each connected to the surfaces of the thermoelectric elements, facing the bottom region of the tub-shaped support elements.

In an embodiment for the housing of the thermoelectric module, the housing can be formed by a box-shaped cover and the tub-shaped support elements, whereby the first wall of the housing is formed by the bottom region of the box-shaped cover and the second wall by the bottom regions of the tub-shaped support elements.

The box-shaped cover can be put over the arrangement of the tub-shaped support elements and then be connected to the tub-shaped support elements. The result is a compact housing with a low number of elements. This makes the production of the housing cost-effective and simple.

It is also expedient, if the thermoelectric elements, with one of the surfaces thereof, are in thermal contact with a bottom region of a tub-shaped support element and with their respective other surface in thermal contact with the bottom region of the box-shaped cover.

This is advantageous, because the bottom regions of the tub-shaped elements and the bottom region of the box-shaped cover each form the interfaces of the thermoelectric module that are subjected to hot and cold fluids during operation. A thermal connection of the thermoelectric elements at these interfaces therefore improves the efficiency of the thermoelectric module.

It is moreover advantageous for the box-shaped cover to have at least a partially peripheral flange.

The box-shaped cover can be connected to other elements of the thermoelectric module via the at least partially peripheral flange. In addition, the flange region can be used to position the thermoelectric module in a device.

In an embodiment, a plate with cutouts for the thermoelectric elements can be arranged between the peripheral edge of the tub-shaped support elements and the box-shaped cover.

The plate additionally increases the stability of the thermoelectric module.

The peripheral edge of the tub-shaped support elements can be connected to one side of the plate and the box-shaped cover is connected to the other side of the plate.

A further increase in the stability of the thermoelectric module is achieved by connecting the tub-shaped support elements to the plate and the box-shaped cover to the plate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

The following FIGS. 1 to 8 each show an incomplete thermoelectric module 11. Inter alia, a part of housing 4, which surrounds thermoelectric elements 1 and plate-shaped support elements 3 and seals them fluid-tight outwardly, is not shown for reasons of clarity. In a complete illustration, the surfaces of thermoelectric elements 1 opposite the plate-shaped support elements would be in thermal contact with a wall of housing 4.

Figure 1:
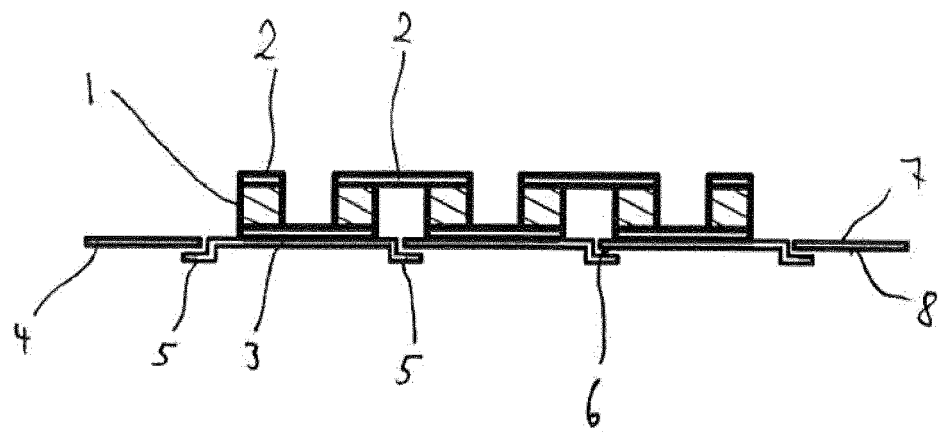
FIG. 1 shows a cut through a housing of a thermoelectric module, with individual thermoelectric elements and support elements on which the thermoelectric elements are placed.

FIG. 1 shows an arrangement of a plurality of thermoelectric elements 1, which are connected in pairs to one another with conductive bridges 2. Thermoelectric elements 1 are arranged here on plate-shaped support elements 3. In the illustration shown in FIG. 1, two adjacent thermoelectric elements 1 each are arranged on one plate-shaped support element 3.

Plate-shaped support elements 3, which are interconnected, here cover a cutout 9 in a wall 7, 8 of a housing 4. To this end, plate-shaped support elements 3 at the junctions to either housing 4 or an adjacent plate-shaped support element 3 have a flange region 5. Overlapping regions 6 arise between adjacent plate-shaped support elements 3 or plate-shaped support elements 3 and housing 4.

Flanges 5 of plate-shaped support elements 3 in the example shown in FIG. 1 are formed by an L-shaped angle, which joins the plate-like region of plate-shaped support element 3 on the side.

In alternative embodiments, designs different from the shown form of flange 5 can be provided. Thus, a flange in C-shape can be used that accommodates the adjacent element in its cutout.

At the junctions between housing 4 and plate-shaped support elements 3 or the junctions between two plate-shaped support elements 3, a connector is inserted, which connects housing 4 to the plate-shaped support elements 3 and the plate-shaped support elements 3 among one another.

The connector is hereby a connector with a sufficiently high ductility, so that plate-shaped support elements 3 are movable against one another and against housing 4. Furthermore, the connector should be sufficiently temperature-resistant, in order to withstand being subjected to a hot fluid without damage, for example, the exhaust gas in an exhaust gas line.

The arrangement of plate-shaped support elements 3 in a cutout 9 of housing 4 is used to absorb stress forces, which occur in the environment of housing 4 due to temperature differences.

In a normal operation, the arrangements as shown in FIGS. 1 to 8, are exposed to a fluid with a high temperature on the surface, facing away from thermoelectric element 1, of plate-shaped support elements 3. The surface opposite plate-shaped support elements 3 of thermoelectric elements 1, in a functioning arrangement is brought into thermal contact with housing 4, which is not shown in FIGS. 1 to 8, however. This part (not shown) of housing 4 is then exposed to a fluid with a lower temperature. A temperature difference arises in this way across the material thickness of thermoelectric elements 1.

Plate-shaped support elements 3 expand because of the higher temperature on their surface. Since both thermoelectric elements 1 and conductive bridges 2 are sensitive to mechanical stresses, as they can occur, e.g., due to thermal stresses, a protective measure should be taken to prevent damage to thermoelectric elements 1 and conductive bridges 2. In FIGS. 1 to 8 this is realized by plate-shaped support elements 3 movable against one another.

Figure 2:
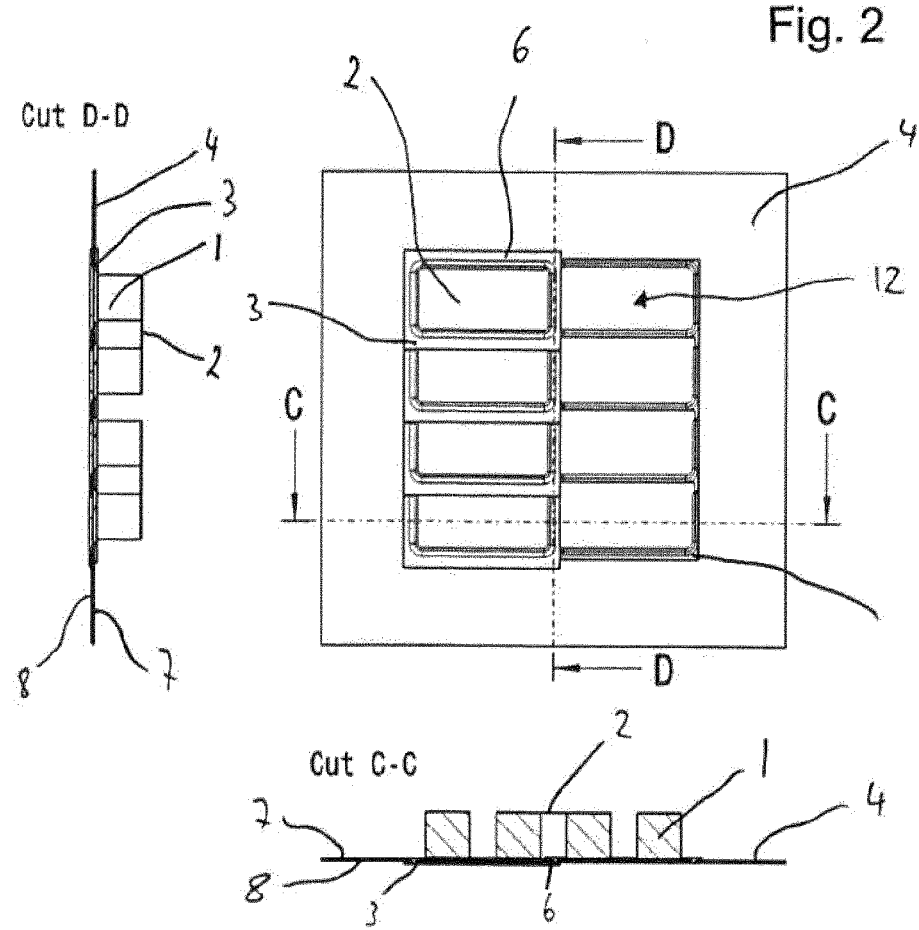
FIG. 2 shows a partial view of a housing of a thermoelectric module in a top plan view and two cuts through this view.

FIG. 2 shows a top plan view of housing 4, as it was already illustrated in FIG. 1. Plate-shaped support elements 3, which overlap each other and parts of housing 4, are visible in the middle of FIG. 4. A sectional view along section axis D-D is illustrated on the left next to this view. A sectional view along section axis C-C is shown in the bottom part of FIG. 2.

The basic structure of thermoelectric elements 1 and conductive bridges 2 corresponds to the structure shown in FIG. 1. Only the arrangement of plate-shaped support elements 3 to one another in FIG. 2 differs from the example in FIG. 1.

The left four plate-shaped support elements 3 are arranged on surface 8, facing the viewer, of housing 4. The right four plate-shaped support elements 3 are arranged on surface 7, facing away from the viewer, of housing 4. The left four plate-shaped support elements 3 overlap each other at their junctions and also housing 4 on surface 8 facing the viewer. The right four plate-shaped support elements 3 also overlap each other as well as surface 7 of housing 4 facing away from the viewer.

Plate-shaped support elements 3 in their totality form thermal stress equalizing device 12. The device completely covers cutout 9 of housing 4.

Two thermoelectric elements 1 are again arranged on each plate-shaped support element 3. Two thermoelectric elements 1 each are also connected to one another via a conductive bridge 2.

Figure 3:
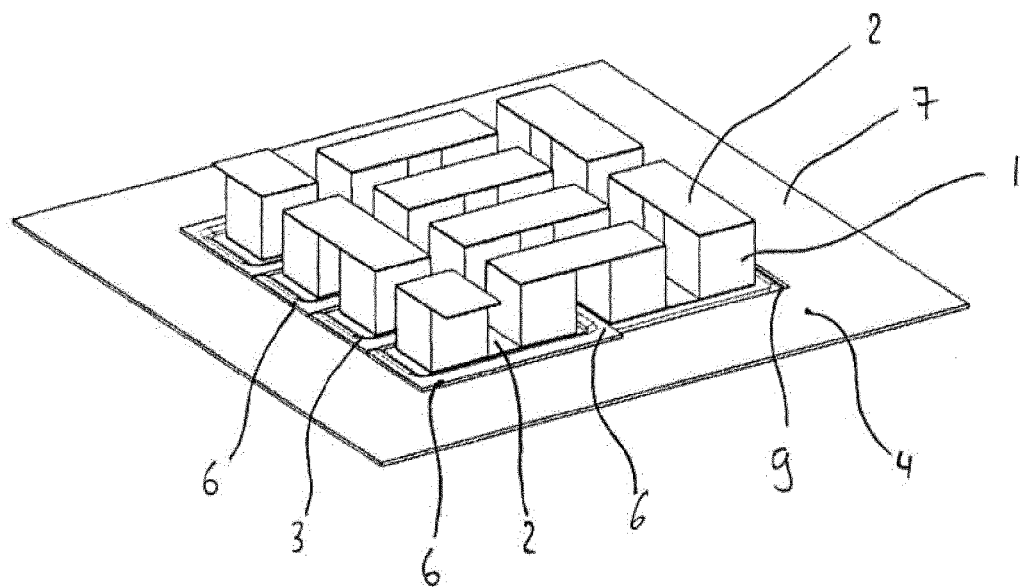
FIG. 3 shows a perspective partial view of a housing of a thermoelectric module according to FIG. 2, whereby here an interior view of the housing part is shown, for which reason the thermoelectric elements within the thermoelectric module and conductive bridges are shown.

FIG. 3 shows a perspective view of the inner side of thermoelectric module 11, which was already shown in the sectional views in FIG. 2. In the perspective view of FIG. 3, it is easily recognized once again that the left four plate-shaped support elements 3 are arranged on the inner side, labeled with surface 7, of housing 4. In contrast, the right plate-shaped support elements 3 are arranged on the outer side, opposite inner surface 7 of housing 4.

It can also be seen in FIG. 3 that the individual plate-shaped support elements 3 overlap each other in a region 6 and likewise overlap housing 4 in its edge regions of cutout 9.

Figure 4:
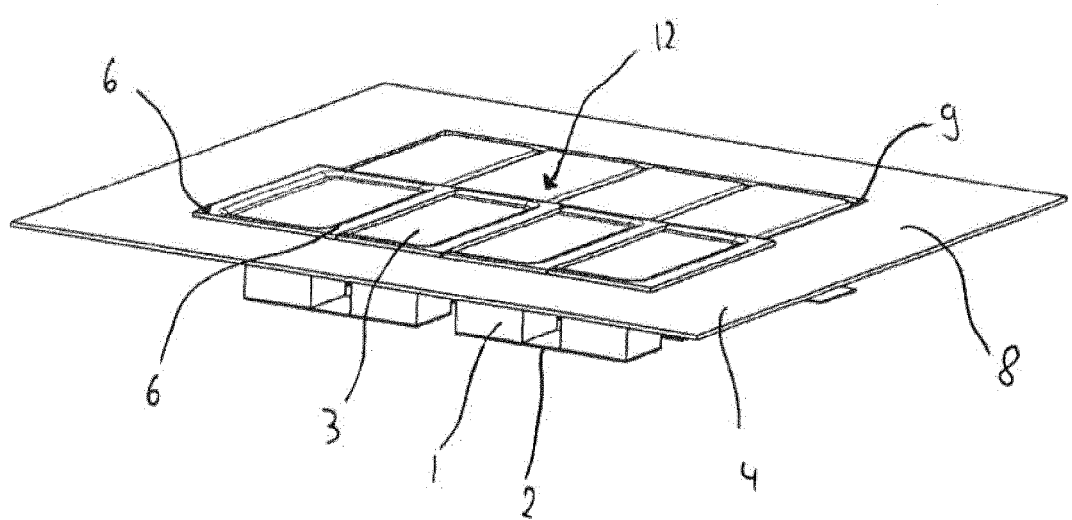
FIG. 4 shows a perspective partial view according to FIGS. 2 and 3, whereby here a view of the outer side of the housing part is shown.

FIG. 4 shows a view of outer surface 8, facing away from thermoelectric elements 1, of housing 4. Especially plate-shaped support elements 3 can now be seen here, which are attached from outer surface 8 to housing 4. Likewise, plate-shaped support elements 3 attached to inner surface 7 are visible as well. As already described, plate-shaped support elements 3 overlap each other and also housing 4. Thermoelectric elements 1 and conductive bridges 2 correspond to the elements already described in FIG. 3.

Plate-shaped support elements 3 that are arranged on inner surface 7 and outer surface 8, together form thermal stress equalizing device 12. By the relative movement of the individual plate-shaped support elements 3 to one another and to housing 4, thermal stress equalizing device 12 can compensate the expansions in length occurring due to temperature and thus reduce the stresses in thermoelectric module 11.

Figure 5:
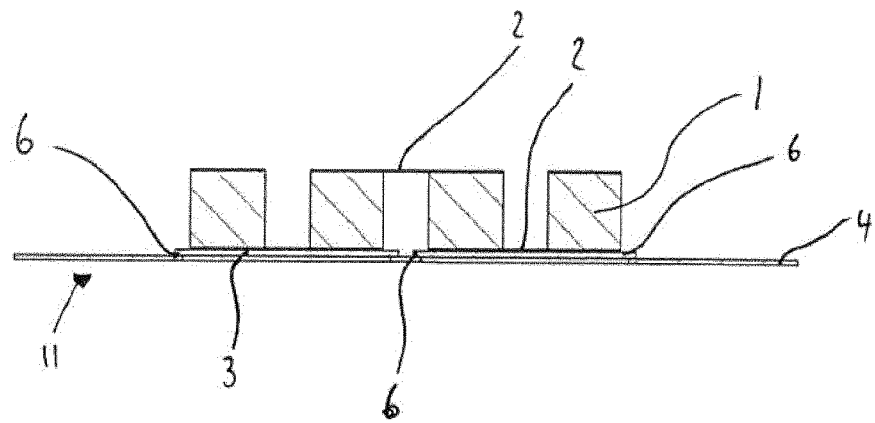
FIG. 5 shows a partial side view of a thermoelectric module, with support elements that are arranged within the thermoelectric module, with thermoelectric elements and conductive bridges.

FIG. 5 shows a further section through a possible embodiment and arrangement of plate-shaped support elements 3 within a thermoelectric module 11.

As in the previous figures, each plate-shaped support element 3 has two thermoelectric elements 1. This also applies to the following FIGS. 6 to 8 and for this reason is not mentioned further.

In FIG. 5, plate-shaped support elements 3 are arranged on inner surface 7 of housing 4.

Figure 6:
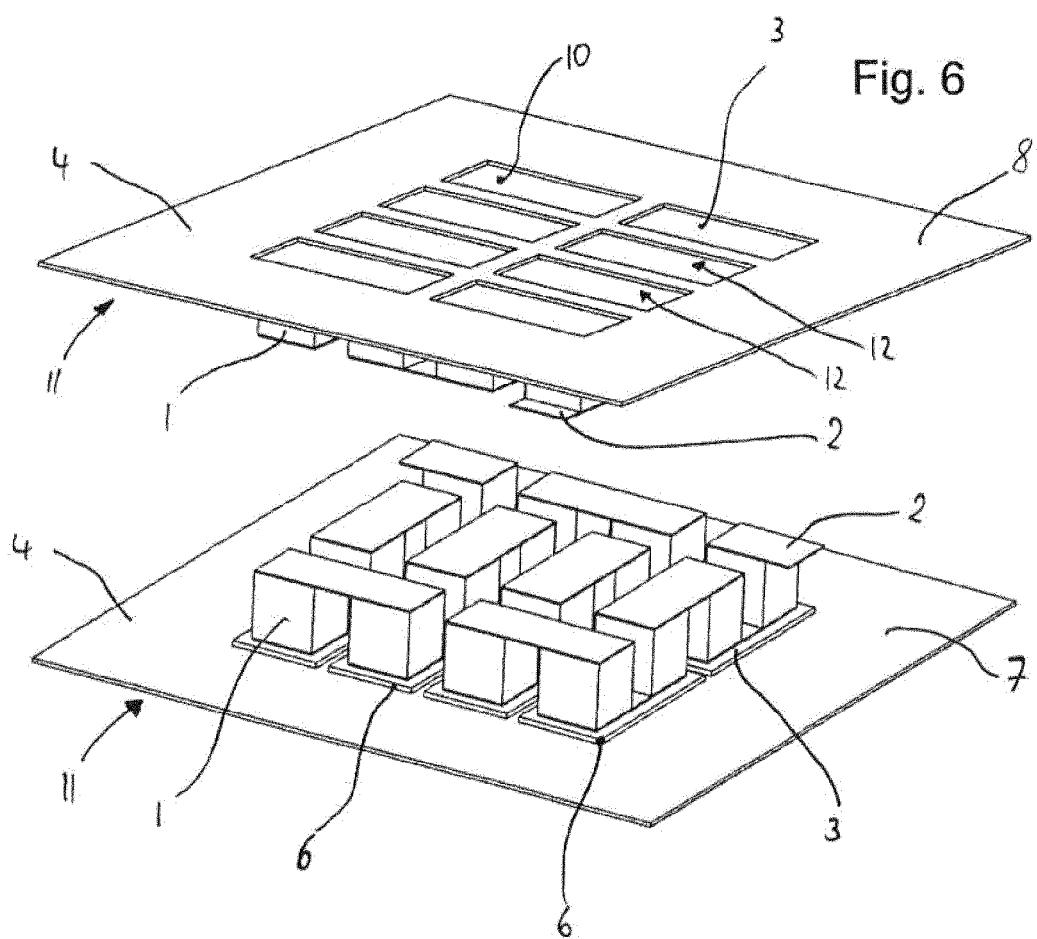
FIG. 6 shows a perspective partial view of the thermoelectric module according to FIG. 5, with a view of the outer side of the housing in the top part of FIG. 6 and a view of the inner side of the housing in the bottom part of FIG. 6.

The top part of FIG. 6 shows a view of housing part 4 from outside. It is especially visible that now instead of a large cutout 9, small cutouts 10 are provided in housing 4.

Each of these cutouts 10 is covered by its own plate-shaped support element 3, which is arranged on inner side 7 of housing 4. The individual plate-shaped support elements 3 have no direct physical contact with adjacent plate-shaped support elements 3. Plate-shaped support elements 3 are each connected only to housing 4 and, as a departure from FIGS. 1 to 4, no longer have a flange 5 on their outer edges.

The individual plate-shaped support elements 3, however, are connected to one another via conductive bridges 2, which connect thermoelectric elements 1, which are arranged on plate-shaped support elements 3. The totality of plate-shaped support elements 3 forms thermal stress equalizing device 12.

The bottom part of FIG. 6 shows a view of inner surface 7 of housing 4. The spatial distance of the individual plate-shaped support elements 3 to one another is especially evident here.

Figure 7:
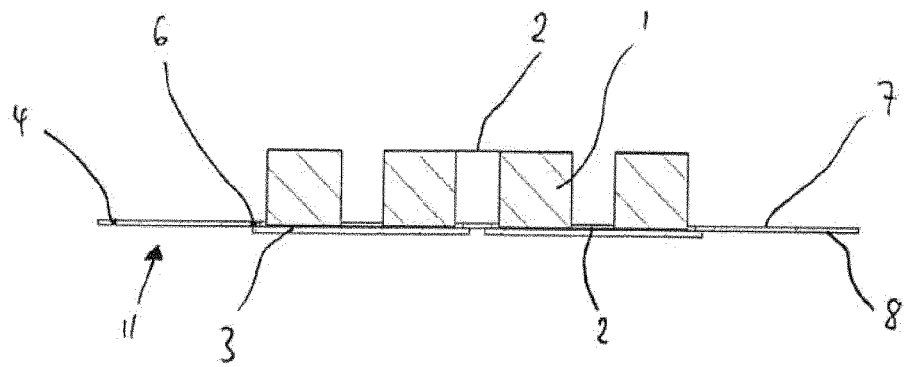
FIG. 7 shows a partial side view of an alternative embodiment of a thermoelectric module, with support elements that are arranged outside the thermoelectric module, with thermoelectric elements and conductive bridges.

FIG. 7 shows an alternative embodiment different from FIG. 5. In the case of FIG. 7, plate-shaped support elements 3 are arranged on housing 4 from outer surface 8. As is also evident in FIGS. 5 and 6, FIG. 7 also has a number of individual cutouts 10, which are individually covered by plate-shaped support elements 3.

Figure 8:
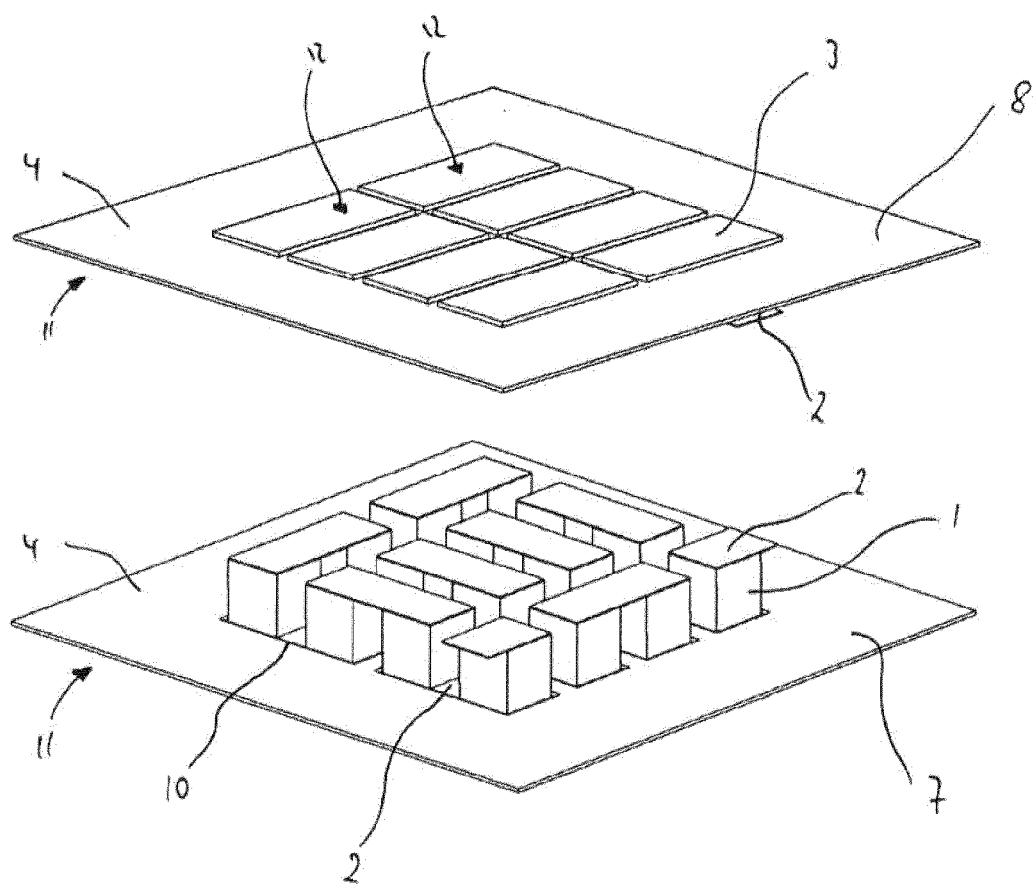
FIG. 8 shows a perspective partial view of the thermoelectric module according to FIG. 7, with a view of the outer side of the housing in the top part of FIG. 8 and a view of the inner side of the housing in the bottom part of FIG. 8.

FIG. 8, like FIG. 6, again shows two perspective views of the arrangement of thermoelectric module 11. Plate-shaped support elements 3 are attached from outer surface 8 of housing 4, as already mentioned in regard to FIG. 7. The bottom half of FIG. 8 shows a top plan view of inner surface 7 of housing 4, as well as thermoelectric elements 1 and conductive bridges 2 connecting them.

As described in FIG. 6, the totality of all plate-shaped support elements 3 constitutes thermal stress equalizing device 12.

In the embodiments shown in FIGS. 1 to 8, in each case, plate-shaped support elements 3 can move relative to housing 4 or to the other plate-shaped support elements 3. In this way, thermal stresses due to expansions in length can be compensated, without the absolute linear dimension of housing 4 being influenced. Plate-shaped support elements 3 during expansion due to the heat only reduce the distances to the other plate-shaped support elements 3 or housing 4. As a result, the mechanical stress on thermoelectric elements 1 is kept to a minimum, so that damage due to stress is effectively prevented.

Glass solder can be used as a suitable connector between plate-shaped support elements 3 and housing 4. Glass solder advantageously has a sufficiently high ductility within certain defined temperature ranges and thus provides a good possible manner for decoupling the individual elements from one another. Moreover, glass solder has a sufficiently high temperature resistance and is also suitable for connecting housing parts fluid-tight to one another, even under temperature stress. Alternatively, the use of other elastic adhesives and materials that allow a sufficiently ductile but nevertheless temperature-resistant connection can also be provided.

Figure 9:
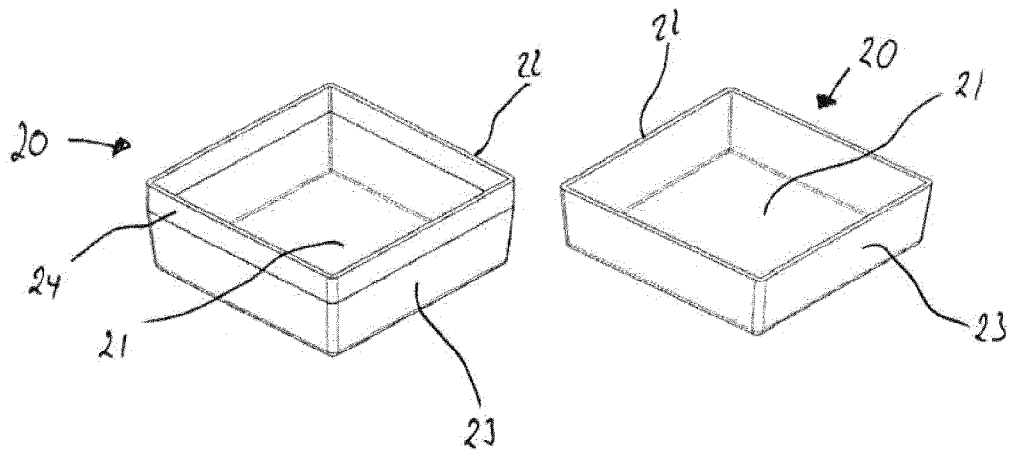
FIG. 9 shows a perspective view of two tub-shaped support elements.

FIG. 9 shows two individual tub-like support elements 20. Tub-like support elements 20 each have a bottom region 21 and a peripheral edge 22 arranged opposite bottom region 21. Tub-like support elements 20 shown in FIG. 9 have substantially a rectangular box-shaped basic shape. Each of the shown tub-shaped support elements 20 has four side walls 23.

The left tub-shaped support element 20 has a top side wall region 24 in the upper region, adjacent to the peripheral edge, of wall 23. The top side wall region 24 stands perpendicular to bottom region 21 of tub-shaped support element 20. Side walls 23, arranged below top side wall region 24, run at an angle, inclined to the center point of tub-shaped support element 20, slightly conically toward bottom region 21.

Tub-shaped support element 20, which is illustrated in the right half of FIG. 9, does not show this top edge region 24 that stands perpendicular to bottom area 21. However, side walls 23 of right tub-shaped support element 20 also run at an inwardly inclined angle conically to bottom region 21.

Figure 10:
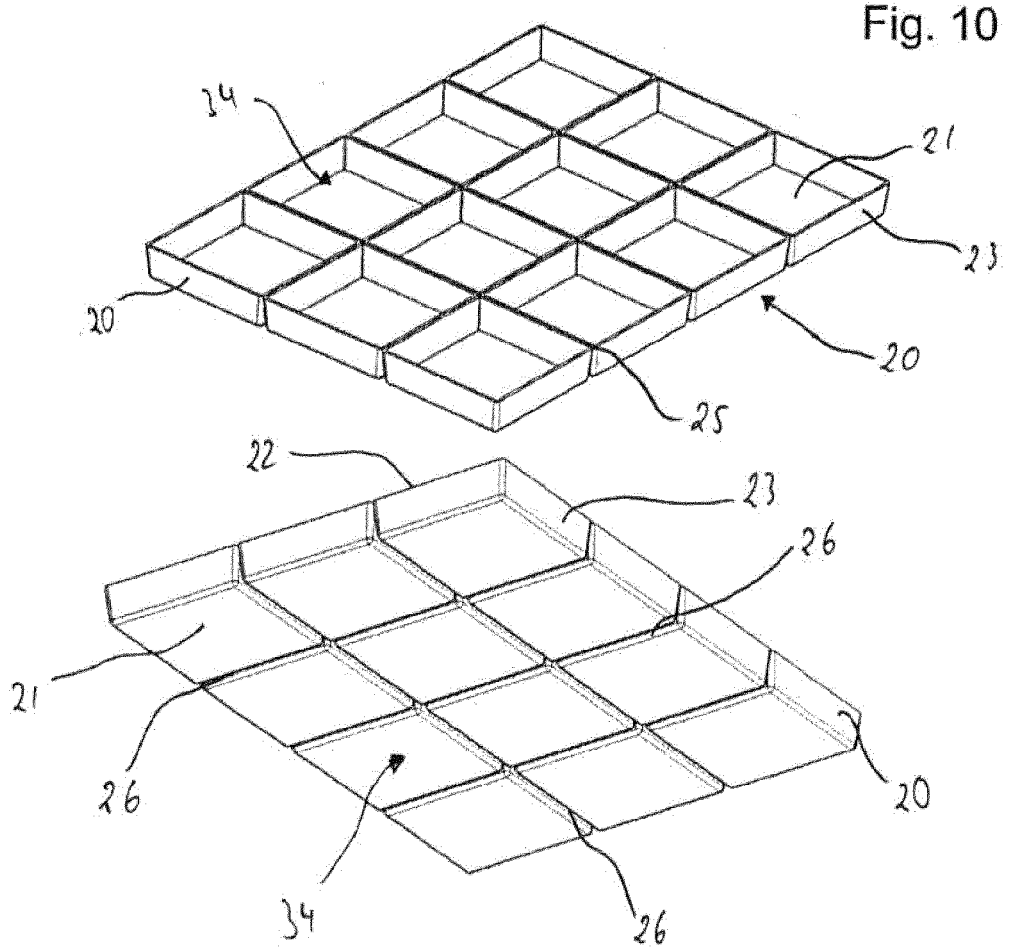
FIG. 10 shows a plurality of interconnected tub-shaped support elements, a view of the inner side of the tub-shaped support elements being shown in the top part of FIG. 10 and a view of the outer side of the tub-shaped support elements being shown in the bottom part of FIG. 10.

FIG. 10 shows two views of an arrangement of a plurality of tub-shaped support elements 20. Here the two arrangements of FIG. 10 are each formed from a plurality of tub-shaped support elements 20, as shown in the right half of FIG. 9.

In the case of FIG. 10, an arrangement is shown comprising three tub-shaped support elements 20 in width and four tub-shaped support elements 20 in length. The individual tub-shaped support elements 20 are connected to one another in the region of their peripheral edge 22 and thus form connection site 25 in their upper region. The top part of FIG. 10 shows a top plan view of tub-shaped support elements 20 open from above.

Alternatively, the same structure is also possible with tub-shaped support elements 20 shown on the left in FIG. 9. As a result, because of the perpendicular sections of top side wall 24, a larger connection site 25 would occur between the individual tub-shaped support elements 20, which would additionally increase the stability of the arrangement.

The totality of tub-shaped support elements 20 forms thermal stress equalizing device 34.

The bottom area of FIG. 10 shows a top plan view of bottom region 21 of tub-shaped support elements 20. A gap 26 arises between the individual adjacent tub-shaped support elements 20 by the conically tapering shape of side walls 23.

Figure 11:
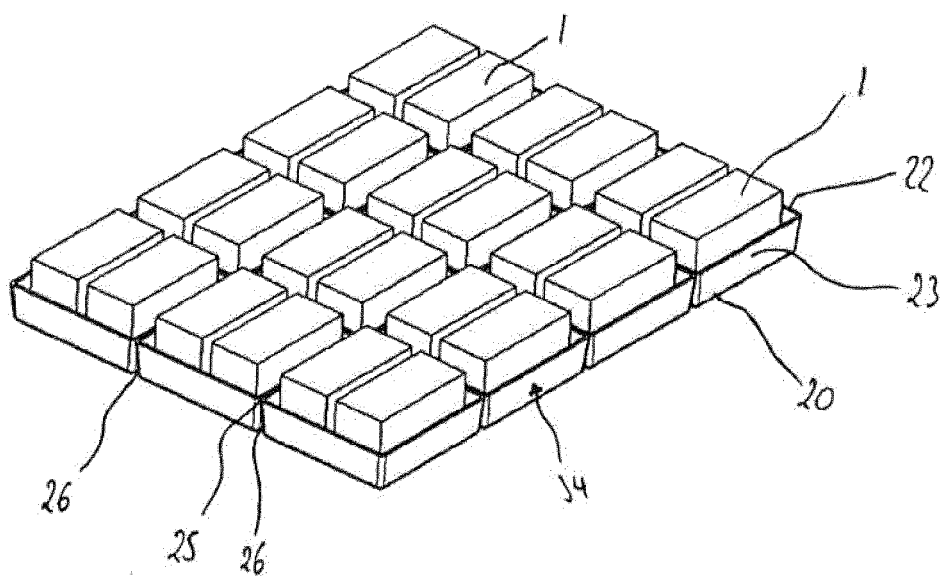
FIG. 11 shows a top plan view of a plurality of tub-shaped support elements according to the top part of FIG. 10, with thermoelectric elements that are inserted within the tub-shaped elements.

FIG. 11 shows an expansion of the arrangement of tub-shaped support elements 20 as shown in FIG. 10. In addition, in FIG. 11 two thermoelectric elements 1 are now inserted in each tub-shaped support element 20. It is not visible in the figure that thermoelectric elements 1 arranged in a tub-shaped support element 20 are connected electrically conductively to one another via conductive bridge 2. The illustrated thermoelectric elements 1 are in thermal contact with tub-shaped support elements 20 via conductive bridges 2.

As already shown in FIG. 10, junctions 25 between tub-shaped support elements 20 and gaps 26, which arise in the vicinity of the bottom region between adjacent tub-shaped support elements 20, are also evident.

All tub-shaped support elements 20 together form thermal stress equalizing device 34.

Figure 12:
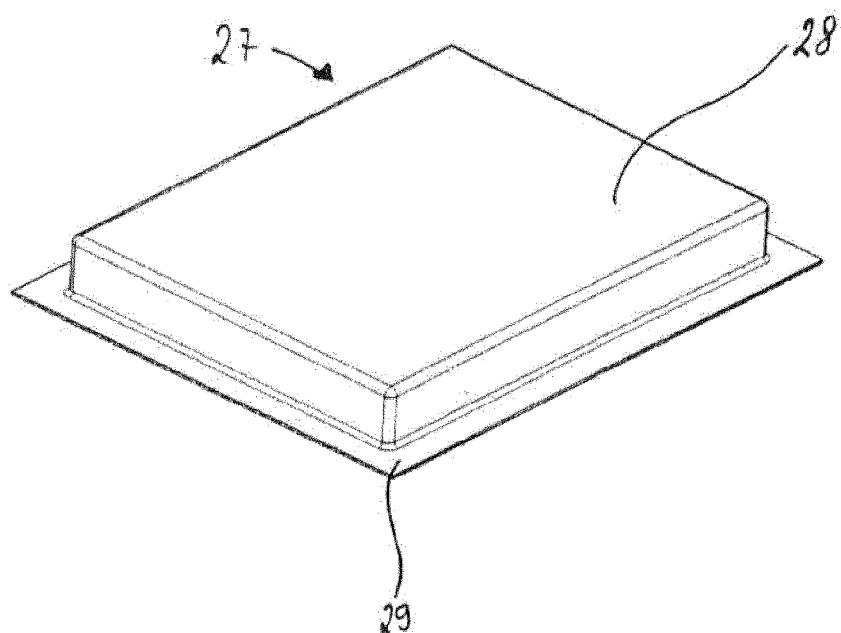
FIG. 12 shows a perspective view of a box-like cover with a peripheral flange that can be placed on the arrangement according to FIG. 11.

FIG. 12 shows a box-like cover 27, which has a bottom region 28. Box-like cover 27 is made open downward away from bottom region 28 and is dimensioned so that the arrangement shown in FIG. 11 can be inserted in box-shaped cover 27. The side walls of box-like cover 27 run substantially perpendicular to bottom region 28. A flange region 29, which in the case of FIG. 12 is made completely peripheral, joins the bottom edge of box-like cover 27.

In alternative embodiments for the box-like cover, as also in the case of tub-shaped support elements 20, conically tapering side walls could be provided. Likewise, only a partially peripheral flange region 29 could be provided.

Figure 13:
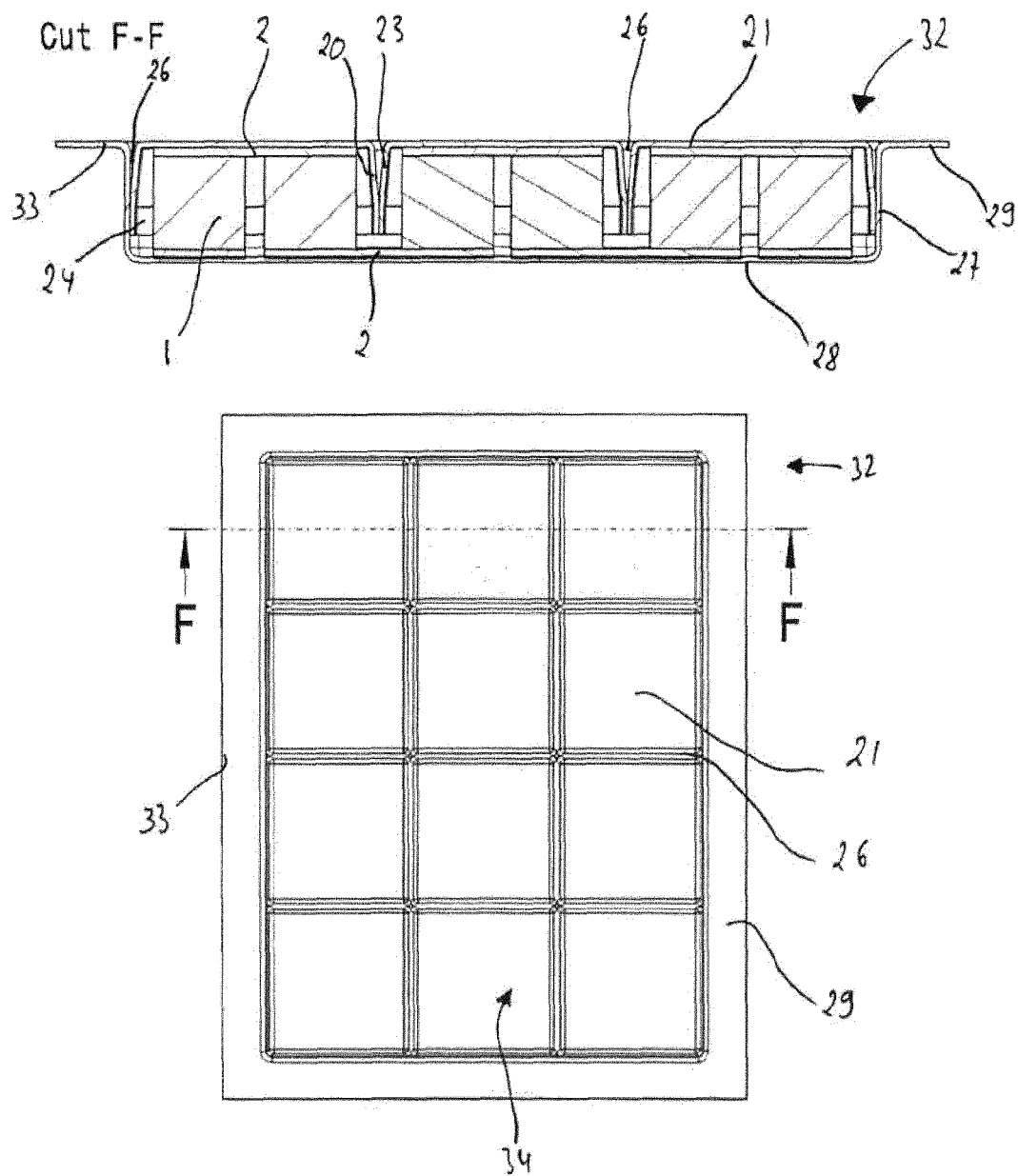
FIG. 13 shows a top plan view of a thermoelectric module, formed from elements according to FIGS. 11 and 12, illustrated in the bottom part of FIG. 13, and furthermore a cut through this thermoelectric module in the top part of FIG. 13.

FIG. 13 now shows in its bottom area a top plan view of a thermoelectric module 32. It includes the arrangement, as already illustrated in FIG. 11, and box-like cover 27 of FIG. 12, which was placed from above on thermoelectric elements 1 and tub-shaped support elements 20.

The view shown in the bottom area in FIG. 13 shows bottom area 21, facing the viewer, of tub-shaped support elements 20, which in their totality form thermal stress equalizing device 34. Peripheral flange 29 of box-like cover 27 is shown around the arrangement of tub-shaped support elements 20. Box-like cover 27 together with bottom region 21 forms housing 33 of thermoelectric module 32.

A view along the section axis F-F is illustrated in the top part of FIG. 13. The inner structure of thermoelectric module 32 can be readily seen in the sectional view F-F. As already described in the previous figures, each of tub-shaped support elements 20 has two thermoelectric elements 1, each of which is connected within tub-shaped support element 20 to a conductive bridge 2. Furthermore, two thermoelectric elements 1 of two adjacent tub-shaped support elements 20 are connected to one another on the side, facing away from tub-shaped support element 20, of thermoelectric elements 1 via conductive bridges 2. In this way, all thermoelectric elements 1 arranged in thermoelectric module 32 are connected electrically conductively to one another.

Bottom region 28 of box-like cover 27 in FIG. 13 forms the first wall of housing 33. Bottom regions 21 of the arrangement of tub-shaped support elements 20 form the second wall of housing 33, which is opposite the first wall.

During operation, bottom regions 21 are now subjected to a hot fluid. Bottom region 28 in contrast is subjected to a cold fluid.

Bottom regions 21 expand due to the heat input of the hot fluid. Gaps 26, which are arranged between tub-shaped support elements 20 and which are arranged between individual tub-shaped support elements 20 and also between box-like cover 27 and the respective outer tub-shaped support elements 20, are reduced in size as a result.

Only an expansion in length of the individual tub-shaped support elements 20 occurs in this way. Thermoelectric module 32 experiences no change in length overall. As in FIGS. 1 to 8, this results in relief for thermoelectric elements 1 and conductive bridges 2 connecting them.

As a departure from tub-shaped support elements 20 of FIG. 11, tub-shaped support elements 20 of FIG. 13 now also have a top side wall region 24 that is arranged perpendicular to bottom region 21. Tub-shaped support elements 20 are connected to one another in the area of this top side wall region 24. Likewise, outer tub-shaped support elements 20 in the area of their top side wall 24 are connected to the side walls of box-shaped cover 27. Peripheral flange 29 of box-like cover 27 in the assembled state lies in a plane with bottom regions 21 of tub-shaped support elements 20.

Figure 14:
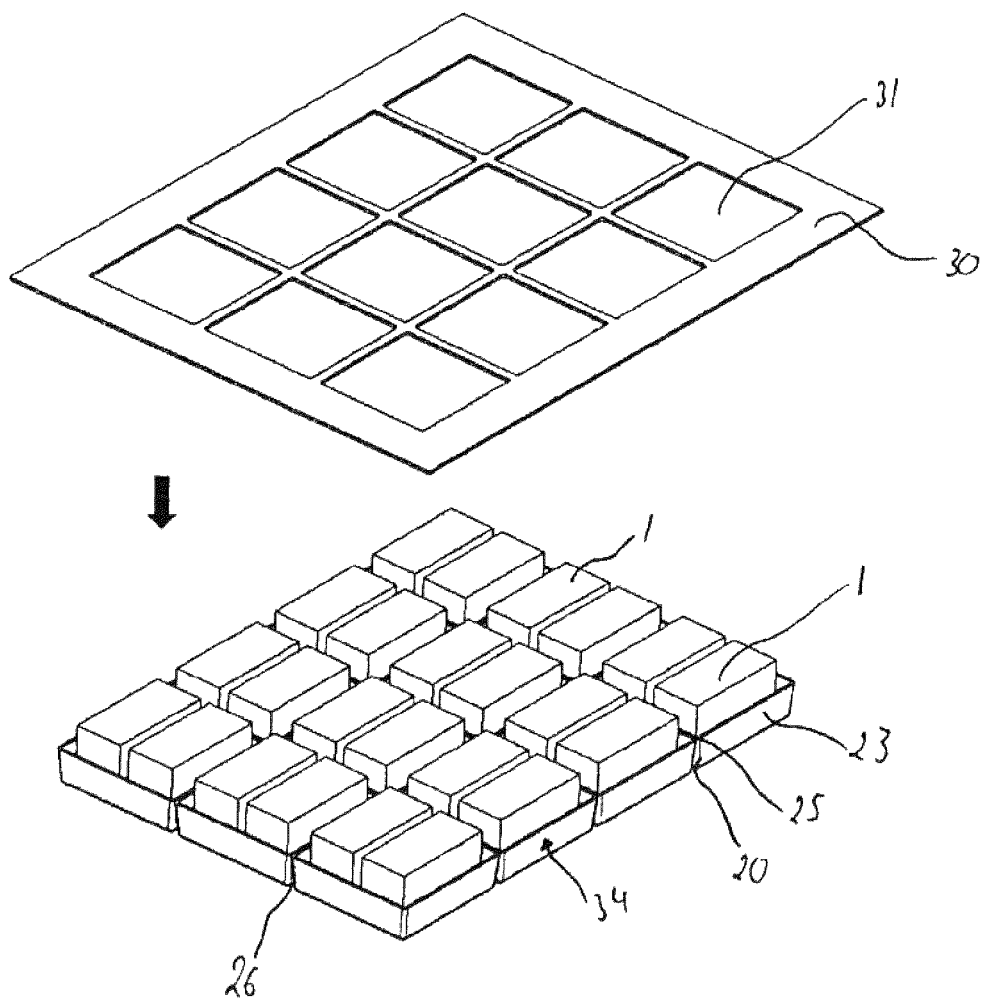
FIG. 14 shows a plate with cutouts for the thermoelectric elements in the top part of FIG. 14 and an arrangement of thermoelectric elements in tub-shaped support elements according to FIG. 11 in the bottom part of FIG. 14.

FIG. 14 shows a variation of the structure of FIG. 11. In addition to tub-shaped support elements 20 that already have two thermoelectric elements 1, a plate 30 is now attached to the arrangement from above, the plate which has cutouts 31 arranged corresponding to thermoelectric elements 1. This plate 30 after assembly comes to lie on junctions 25 of tub-shaped support elements 20 and is there connected to tub-shaped support elements 20. The remaining structure of FIG. 14 corresponds to that in FIG. 11.

Figure 15:
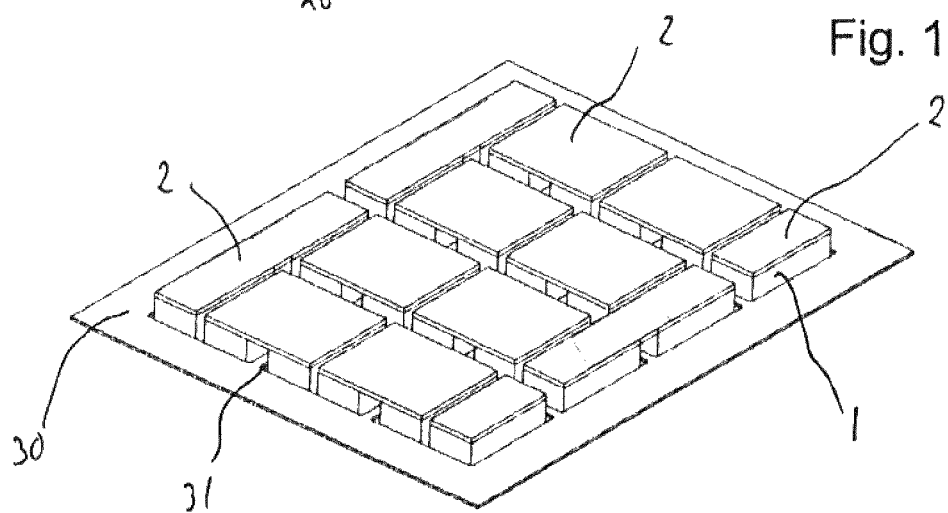
FIG. 15 shows a perspective view of an assembly of the elements in FIG. 14 with additional conductive bridges, which have been attached to the thermoelectric elements after the placement of the plate on the tub-shaped elements.

FIG. 15 now shows a further development of FIG. 14. After plate 30 has been placed on the arrangement of tub-shaped support elements 20, the individual thermoelectric elements 1 are connected electrically conductively to one another by conductive bridges 2.

As already indicated in FIG. 13, the connection of thermoelectric elements 1 occurs in that in each case two thermoelectric elements 1, which are arranged in tub-shaped support elements 20 adjacent to one another, are connected to one another. Cutouts 31 of plate 30 are thereby arranged so that in each case the two thermoelectric elements 1, which are arranged within a tub-shaped support element 20, pass through a cutout 31.

Figure 16:
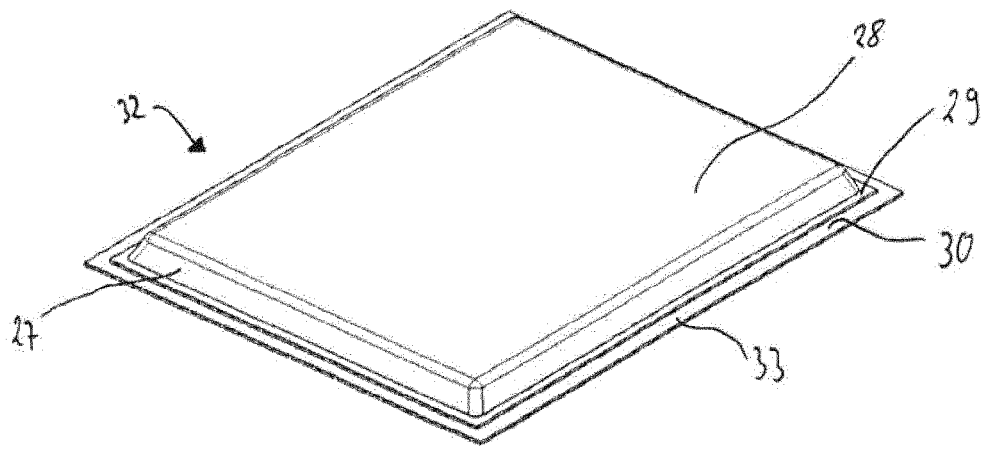
FIG. 16 shows a perspective view of a thermoelectric module according to FIG. 15, with a mounted cover.

FIG. 16 shows a further development of the structure in FIGS. 14 and 15. In addition, a box-shaped cover 27 with a peripheral flange region 29, is now placed from above on plate 30. The box-like cover 27 is connected with plate 30 at flange region 29. Thermoelectric module 32 is closed by box-like cover 27. Tub-shaped support elements 20 with box-like cover 27 form housing 33 of thermoelectric module 32.

Figure 17:
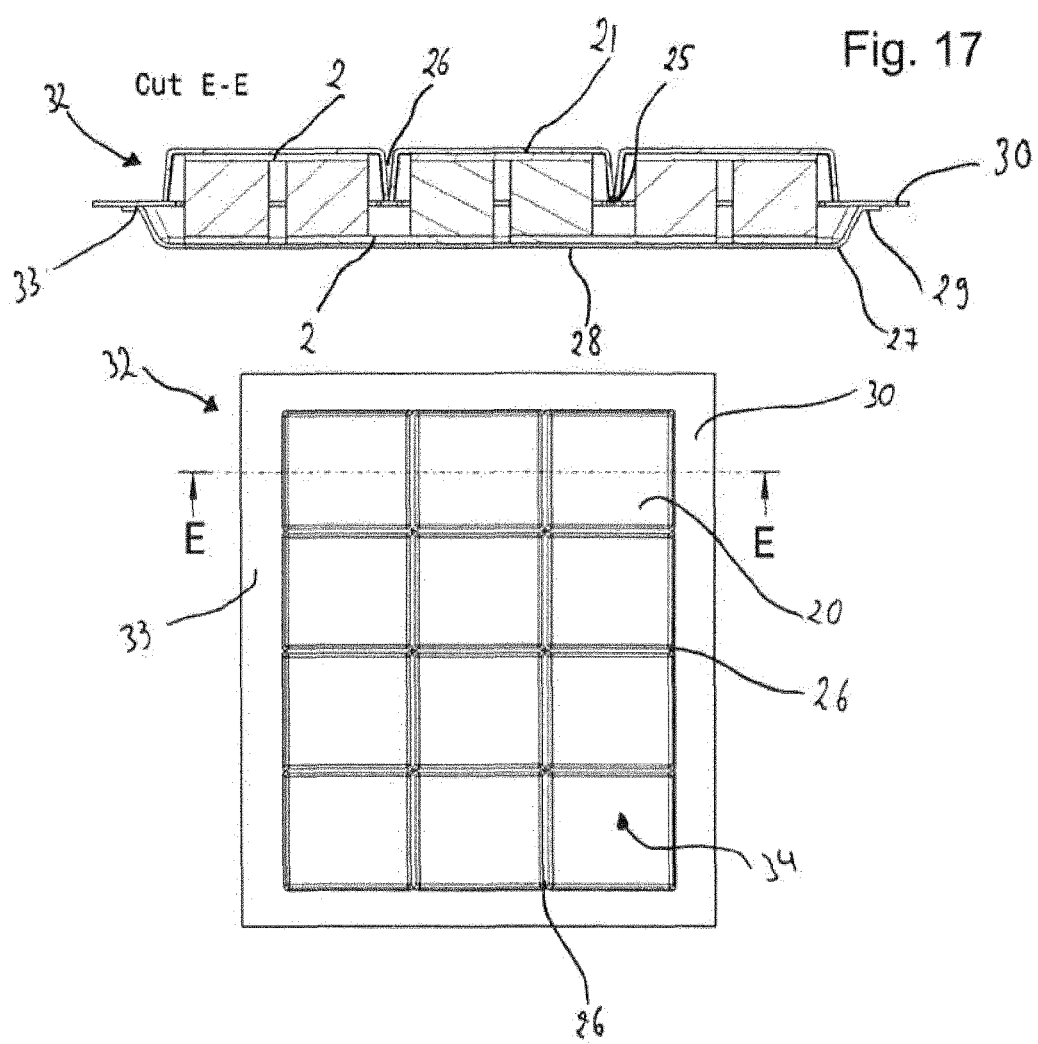
FIG. 17 shows a top plan view of a thermoelectric module according to FIG. 16 in the bottom part of FIG. 17, and a cut through the thermoelectric module in the top part of FIG. 17.

FIG. 17 shows a view of thermoelectric module 32 of FIG. 16. A view of tub-shaped support elements 20 is illustrated in the bottom area. A sectional view along section axis E-E is illustrated in the top area of FIG. 17.

It can be recognized here again that in each case two thermoelectric elements 1 within a tub-shaped support element 20 are connected to one another via a conductive bridge 2. Thermoelectric elements 1 adjacent to one another are connected electrically conductively to one another with a conductive bridge 2 on the surface opposite tube bottom region 21.

As in FIG. 13, bottom regions 21 form the one wall of housing 33 that is subjected to a hot fluid in the operational state. The wall of housing 33 at the same time forms thermal stress equalizing device 34 having the totality of tub-shaped support elements 20.

Bottom region 28 forms the second wall of housing 33, which is subjected to a cold fluid in the operational state. Gaps 26 arising between tub-shaped support elements 20 again serve here as well as a free space for compensating the expansion of the individual tub-shaped support elements 20 due to high temperatures.

As a departure from thermoelectric module 32, shown in FIG. 13, the side walls of housing 33 are now formed both by box-like cover 27 and by side walls 23 of outer tub-shaped support elements 20. Box-like cover 27 has no direct connecting point with tub-shaped support elements 20. Both box-like cover 27 and also tub-shaped support elements 20 are connected only to plate 30.

In alternative embodiments, basic shapes different from the rectangular basic shape of tub-shaped support elements 20 can also be provided. This is not limited to basic shapes only with straight side walls; however these are to be preferred from the manufacturing-related standpoint.

It is crucial for tub-shaped support elements 20 that the design of the side walls is such that they taper conically from their peripheral edge 22 toward bottom region 21. Gap 26 between the individual tub-shaped support elements 20 is formed by this tapering shape. The gap 26 is important to be able to compensate the expansion in length of the individual tub-shaped support elements 20 and thereby to be able to protect from damage thermoelectric elements 1 and the conductive bridges connecting them.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A thermoelectric module comprising:
a housing with at least two opposite walls;
a plurality of thermoelectric elements that have at least two opposite surfaces; and
a plurality of conductive bridges,
wherein at least two of the thermoelectric elements are connected to a first surface of one of the conductive bridges and a second surface of the one of the conductive bridges is connected to a support element, such that a combination of the at least two of the thermoelectric elements and the one of the conductive bridges is in thermal contact with the support element,
wherein a wall of the housing has a cutout that is formed as a hole that extends entirely through the wall,
wherein at least one thermal stress equalizing device is arranged in the thermoelectric module, and wherein the thermal stress equalizing device is formed by a plurality of the support elements, the support elements being plate-shaped each having an upper surface upon which the conductive bridges are positioned, a lower surface that opposes the upper surface and side edges,
wherein individual plate-shaped support elements are elastically connected at their side edges to adjacent plate-shaped support elements, and
wherein at least one side edge of at least two of the plate-shaped support elements have an at least partially peripheral flange region that has a bent peripheral flange extending therefrom.

2. The thermoelectric module according to claim 1, wherein at least one of the plate-shaped support elements is connected elastically to a wall of the housing.

3. The thermoelectric module according to claim 1, wherein the plate-shaped support elements cover the cutout in the housing of the thermoelectric module in a fluid-tight manner.

4. The thermoelectric module according to claim 1, wherein one of the surfaces of the thermoelectric elements are in thermal contact with one of the walls of the housing and the respective other surface of the thermoelectric elements are in thermal contact with the plate-shaped support elements.

5. The thermoelectric module according to claim 1, wherein at least one of the plate-shaped support elements overlaps the housing at a connection site between the support element and the housing, and/or overlaps another support element at a connection site between the support element and the another support element.

6. The thermoelectric module according to claim 1, wherein the plate-shaped support elements are movable relative to one another and are movable relative to the housing of the thermoelectric module.

7. A thermoelectric module comprising:
a housing;
a plurality of thermoelectric elements that have at least two opposite surfaces; and
a plurality of conductive bridges,
wherein at least two of the thermoelectric elements are connected to a first surface of one of the conductive bridges and a second surface of the one of the conductive bridges is connected to a support element, such that a combination of the at least two of the thermoelectric elements and the one of the conductive bridges is in thermal contact with the support element, and
wherein the support element is formed as at least two tub-shaped support elements and wherein at least one thermal stress equalizing device is arranged in the thermoelectric module, the at least one thermal stress equalizing device formed by the tub-shaped support elements, the tub-shaped support elements each having a bottom region and a peripheral side edge protruding from and extending around a periphery of the bottom region to form a tub shape having a concave space therein, the thermoelectric elements being positioned inside of the concave space of the tub shape.

8. The thermoelectric module according to claim 7, wherein the tub-shaped support elements are connected to one another at their respective peripheral side edges, and wherein a gap is left between the bottom regions of adjacent tub-shaped support elements.

9. The thermoelectric module according to claim 7, wherein each of the tub-shaped support elements has at least two thermoelectric elements provided therein, which are connected to at least one of the conductive bridges.

10. The thermoelectric module according to claim 7, wherein at least two thermoelectric elements of two adjacent tub-shaped support elements are connected to one another via a conductive bridge.

11. The thermoelectric module according to claim 7, further comprising a box-shaped cover, wherein the tub-shaped support elements are positioned inside the box-shaped cover, wherein the housing of the thermoelectric module is formed by a combination of the box-shaped cover and the tub-shaped support elements, and wherein a first wall of the housing is formed by a bottom region of the box-shaped cover and a second wall of the housing is formed by the bottom regions of the tub-shaped support elements.

12. The thermoelectric module according to claim 11, wherein one of the surfaces of the thermoelectric elements are in thermal contact with the bottom regions of the tub-shaped support elements, respectively, and the respective other surface of the thermoelectric elements are in thermal contact with the bottom region of the box-shaped cover.

13. The thermoelectric module according to claim 11, wherein the box-shaped cover has an at least partially peripheral flange.

14. The thermoelectric module according to claim 11, further comprising a plate positioned physically between the tub-shaped support elements and the box-shaped cover, the plate having cutouts for accommodating the thermoelectric elements, wherein the plate is arranged between the peripheral edge of the tub-shaped support elements and the box-shaped cover, the thermoelectric elements extending through the cutouts of the plate when the plate is arranged.

15. The thermoelectric module according to claim 14, wherein the tub-shaped support elements are connected to one side of the plate and the box-shaped cover is connected to the other opposing side of the plate.

16. The thermoelectric module according to claim 1, wherein at least one of the plate-shaped support elements overlaps another support element at a connection site between the at least one of the support elements and the another support element.

17. The thermoelectric module according to claim 1, wherein the bent peripheral flange of one plate-shaped support element accommodates an edge region of an adjacent plate-shaped support element aligned therewith.

18. The thermoelectric module according to claim 1, wherein the plate-shaped support elements are aligned adjacent to one another such that the plate-shaped support elements extend along a same plane.

19. The thermoelectric module according to claim 8, wherein side walls of the tub-shaped support elements are inclined inwardly from the peripheral edge towards the bottom region, such that the gap is provided between the adjacent tub-shaped support elements.

* * * * *